(12) United States Patent
Fujii

(10) Patent No.: US 9,433,096 B2
(45) Date of Patent: Aug. 30, 2016

(54) WIRING BOARD, SEMICONDUCTOR DEVICE AND METHOD FOR MANUFACTURING WIRING BOARD

(71) Applicant: Shinko Electric Industries Co., LTD., Nagano-ken (JP)

(72) Inventor: Satoshi Fujii, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 512 days.

(21) Appl. No.: 13/648,842

(22) Filed: Oct. 10, 2012

(65) Prior Publication Data

US 2013/0100625 A1 Apr. 25, 2013

(30) Foreign Application Priority Data

Oct. 12, 2011 (JP) ................................. 2011-225062

(51) Int. Cl.
| | | |
|---|---|---|
| *H05K 1/18* | (2006.01) | |
| *H05K 1/03* | (2006.01) | |
| *H05K 1/11* | (2006.01) | |
| *H05K 3/42* | (2006.01) | |
| *H05K 3/46* | (2006.01) | |

(52) U.S. Cl.
CPC .............. *H05K 1/18* (2013.01); *H05K 1/0366* (2013.01); *H05K 1/115* (2013.01); *H05K 3/42* (2013.01); *H05K 3/427* (2013.01); *H05K 3/4644* (2013.01); *H05K 2201/029* (2013.01); *H05K 2201/09563* (2013.01); *Y10T 29/49165* (2015.01)

(58) Field of Classification Search
CPC ........ H05K 1/366; H05K 1/115; H05K 1/18; H05K 3/42; H05K 3/427; H05K 3/4644; H05K 2201/029; H05K 2201/09563; Y10T 29/49165
USPC ......................................................... 174/262
See application file for complete search history.

(56) References Cited

U.S. PATENT DOCUMENTS

| | | | |
|---|---|---|---|
| 2005/0218503 A1* | 10/2005 | Abe ................... | H01L 23/49822 257/700 |
| 2007/0120249 A1* | 5/2007 | Kawamoto ....... | H01L 23/49822 257/702 |
| 2010/0163297 A1 | 7/2010 | Kajihara | |
| 2011/0232953 A1* | 9/2011 | Oga et al. ..................... 174/258 | |

FOREIGN PATENT DOCUMENTS

| | | |
|---|---|---|
| JP | 11-274730 A | 10/2012 |
| WO | WO 2010/076875 A | 7/2010 |

* cited by examiner

*Primary Examiner* — Timothy Thompson
*Assistant Examiner* — Paul McGee, III
(74) *Attorney, Agent, or Firm* — Wolf, Greenfield & Sacks, P.C.

(57) ABSTRACT

A wiring board includes a resin substrate in which reinforcement members are arranged horizontally, a through electrode filled in a through hole penetrating the substrate in a thickness direction, and wiring layers respectively formed on both surfaces of the substrate and electrically connected to each other via the through electrode. The reinforcement members are arranged such that reinforcement members arranged in a middle region of the substrate in the thickness direction has higher density than reinforcement members arranged in the regions other than the middle region of the substrate.

13 Claims, 10 Drawing Sheets

Fig.7A

Sample A
(Ra=0.08 μm)
5.79 μm — 220
— 210
— 200

Fig.7B

Sample B
(Ra=0.14 μm)
6.59 μm — 220
— 210
— 200

Fig.7C

Sample C
(Ra=0.17 μm)
7.26 μm — 220
— 210
— 200

Fig.7D

Sample D
(Ra=0.52 mm)
10.7 μm — 220
— 210
— 200

WIRING BOARD, SEMICONDUCTOR DEVICE AND METHOD FOR MANUFACTURING WIRING BOARD

CROSS-REFERENCE TO RELATED APPLICATIONS

This application is based upon and claims the benefit of priority from prior Japanese Patent Application No. 2011-225062, filed on Oct. 12, 2011, the entire contents of which are incorporated herein by reference.

FIELD

The embodiments discussed herein are related to a wiring board, a semiconductor device and a method for manufacturing the wiring board.

BACKGROUND

One example of a wiring board on which electronic components such as semiconductor devices are mounted is a build-up wiring board in which wiring layers and insulating layers are laminated on upper and lower surfaces of a core substrate according to a build-up method in order to increase the density of a wiring pattern.

In the build-up wiring board, a through hole which penetrates the core substrate is formed and a conductive layer is formed on an inner wall surface of the through hole. Wiring layers formed on both surfaces of the core substrate are connected electrically via the conductive layer (see Japanese Laid-Open Patent Publication No. 11-274730). In general, the through hole is filled with a resin.

There has also been proposed a wiring board on which electronic components can be mounted in a position immediately above a through hole in order to expand an area for mounting electronic components on the wiring board. Such a wiring board is provided with a metal layer formed immediately above a through hole (the conductive layer and resin in the through hole).

SUMMARY

With advancement of high performance in electronic apparatuses, a demand for increasing the density of a wiring pattern for semiconductor package and wiring board are growing. In conjunction with further miniaturization of a wiring pattern to meet the demand, a diameter of the through hole needs to be reduced. However, a through hole with a smaller diameter makes it difficult to fill a resin in the through hole, causing a problem such that formation of a metal layer on the resin becomes difficult.

One aspect of the present invention is a wiring board including a resin substrate in which a plurality of reinforcement members are arranged horizontally. A through electrode is filled in a through hole penetrating the substrate in a thickness direction. Wiring layers are respectively formed on both surfaces of the substrate and electrically connected to each other via the through electrode. The plurality of reinforcement members are arranged such that reinforcement members arranged in a middle region of the substrate in the thickness direction has higher density than reinforcement members arranged in the regions other than the middle region of the substrate.

Other aspects and advantages of the present invention will become apparent from the following description, taken in conjunction with the accompanying drawings, illustrating by way of example the principles of the invention.

BRIEF DESCRIPTION OF DRAWINGS

The invention, together with objects and advantages thereof, may best be understood by reference to the following description of the presently preferred embodiments together with the accompanying drawings in which:

FIGS. 7A to 7D indicate results of an experiment for evaluating a plating deposition rate corresponding to the surface roughness of foundations of electrolytic copper plating;

DESCRIPTION OF EMBODIMENTS

Embodiments will be explained below with reference to accompanying drawings. In the accompanying drawings, featured portion(s) may be enlarged for the convenience of reference and easy understanding of the features and each component is not necessarily illustrated with the same dimensional ratio as an actual dimensional ratio. In the cross sectional views, for easy understanding of a sectional structure of each member, hatching of insulating layers is omitted.

A first embodiment will be explained below referring to FIG. 1 to FIG. 8.

Figure 1A:
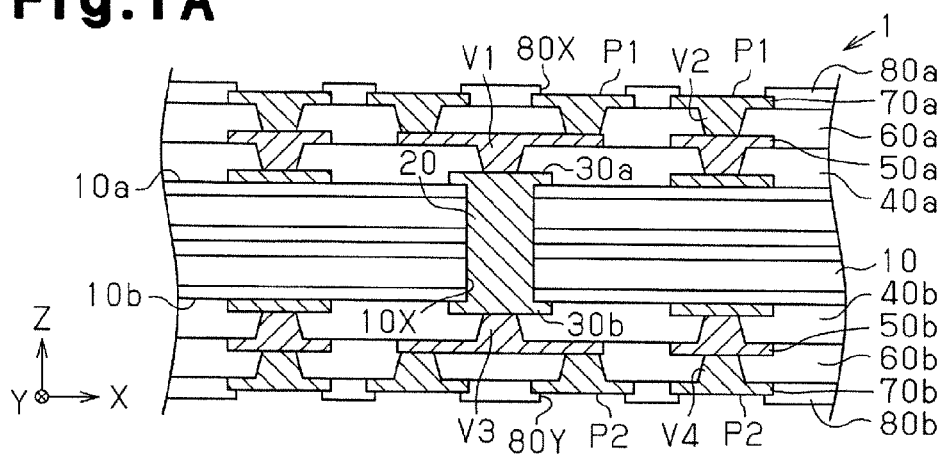
FIG. 1A is a schematic partial cross sectional view of a wiring board according to a first embodiment.

As illustrated in FIG. 1A, a wiring board 1 includes a core substrate 10 arranged at a substantially middle position in a thickness direction of the wiring board 1 (Z direction). The core substrate 10 may be a so-called glass-epoxy substrate which is obtained by, for example, having glass cloths (glass woven fabric) as reinforcement members to be impregnated with a thermosetting insulating resin containing an epoxy resin as a major component and then hardened. The reinforcement member is not limited to a glass cloth and other materials, such as glass nonwoven fabric, aramid woven fabric, aramid nonwoven fabric, liquid crystal polymer (LCP) woven fabric or LCP nonwoven fabric, may be used. The thermosetting insulating resin is not limited to an epoxy resin and resin materials such as polyimide resin or cyanate resin may be used. The core substrate 10 has a thickness in a range of, for example, about 80 μm to about 400 μm.

The core substrate 10 is provided with through holes arranged in predetermined places (one through hole 10X is illustrated in FIG. 1A). The through hole 10X is formed so as to penetrate the core substrate 10 from a first surface 10a to a second surface 10b. Formed inside the through hole 10X is a through electrode 20 which penetrates the core substrate 10 in the thickness direction. That is, the through electrode 20 is filled in the through hole 10X. As a non-limited example, the through electrode 20 is, for example, cylindrical and has a diameter of about 50 μm to about 100 μm. Examples of a material usable for the through electrode 20 include copper (Cu) and a copper alloy.

The first surface 10a of the core substrate 10 is provided with a wiring layer 30a. The second main surface 10b of the core substrate 10 is provided with a wiring layer 30b. These wiring layers 30a and 30b are connected to each other electrically via the through electrode 20. Examples of a material usable for these wiring layers 30a and 30b include copper and a copper alloy.

Next, a structure surrounding the through electrode 20 will be explained.

Figure 1B:
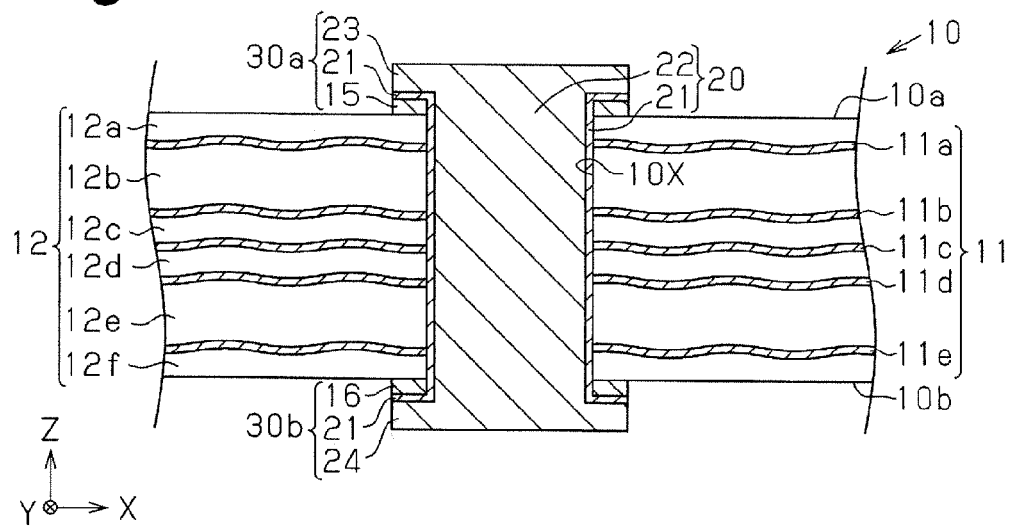
FIG. 1B is an enlarged cross sectional view of a surrounding area of a through hole in the wiring board of FIG. 1A.

As illustrated in FIG. 1B, a copper foil 15 is formed on the first surface 10a of the core substrate 10 and a copper foil 16 is formed on the second surface 10b of the core substrate 10. The through hole 10X, in which the through electrode 20 is formed, is formed so as to penetrate the core substrate 10 and the copper foils 15 and 16 in the thickness direction. A metal foil 21 is formed so as to cover the entire inner wall surface of the through hole 10X. The metal foil 21 also covers an upper surface of the copper foil 15 and a lower surface of the copper foil 16. A conductive layer 22 is filled in a space inside the metal foil 21 in the through hole 10X. The through electrode 20 is formed by the metal foil 21 and the conductive layer 22 formed inside the through hole 10X.

In an upper end surface side of the through electrode 20, a conductive layer 23 is formed so as to coat an upper end surface of the through electrode 20. The wiring layer 30a is formed by the copper foil 15, the metal foil 21 and the conductive layer 23. On a lower end surface side of the through electrode 20, a conductive layer 24 is formed so as to coat an lower end surface of the through electrode 20. The wiring layer 30b is formed by the copper foil 16, the metal foil 21 and the conductive layer 24.

As illustrated in FIG. 1A, wiring layers and insulating layers are laminated on the first surface 10a and the second surface 10b of the core substrate 10.

Figure 11:
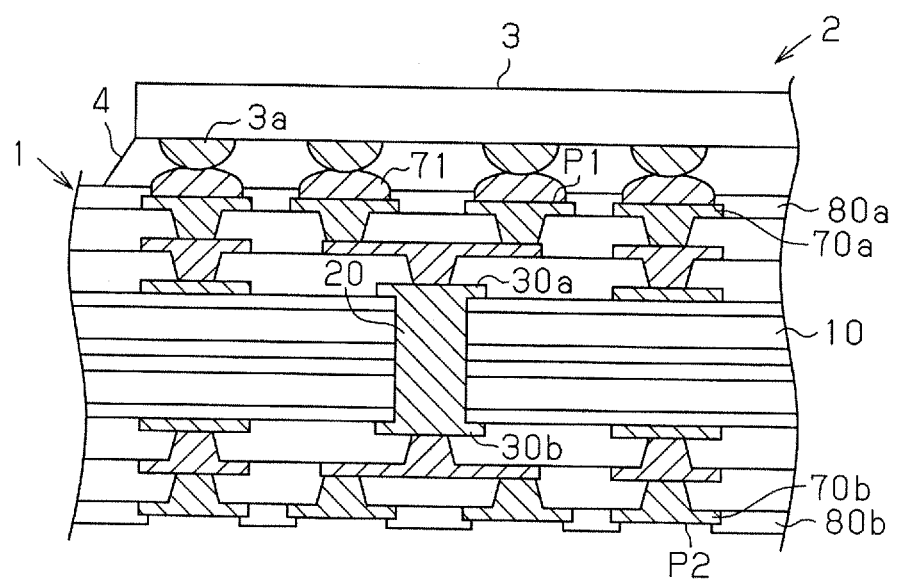
FIG. 11 is a schematic cross sectional view illustrating a semiconductor device according to a second embodiment.

In the illustrated embodiment, laminated on the first surface 10a of the core substrate 10 are an insulating layer 40a for coating the wiring layer 30a, a wiring layer 50a formed above the insulating layer 40a, an insulating layer 60a for coating the wiring layer 50a, a wiring layer 70a formed above the insulating layer 60a and a solder resist layer 80a formed above the insulating layer 60a and the wiring layer 70a. The insulating layer 40a includes vias V1 for electrically connecting the wiring layer 30a and the wiring layer 50a, and the insulating layer 60a includes vias V2 for electrically connecting the wiring layer 50a and the wiring layer 70a. The solder resist layer 80a includes openings 80X through which the wiring layer 70a is partially exposed on the uppermost layer as connection pads P1. The connection pads P1 are for use in connecting electronic components such as, for example, a semiconductor chip 3 as illustrated in FIG. 11. As needed, a metal layer may be formed on the connection pads P1. Examples of the metal layer include a gold (Au) layer, a nickel (Ni)/Au layer (i.e., metal layer formed by laminating Ni layer and Au layer in this order), and an Ni/palladium (Pd)/Au layer (i.e., metal layer formed by laminating Ni layer, Pd layer and Au layer in this order).

Examples of a material usable for the wiring layers 50a and 70a and the vias V1 and V2 include copper and a copper alloy. Examples of a material usable for the insulating layers 40a and 60a include an insulating resin such as an epoxy-based resin and a polyimide-based resin. Examples of a material usable for the solder resist layer 80a include an insulating resin such as an epoxy-based resin.

Laminated on the second surface 10b of the core substrate 10 are an insulating layer 40b for coating the wiring layer 30b, a wiring layer 50b formed below the insulating layer 40b, an insulating layer 60b for coating the wiring layer 50b, a wiring layer 70b formed below the insulating layer 60b and a solder resist layer 80b formed below the insulating layer 60b and the wiring layer 70b. The insulating layer 40b includes vias V3 for electrically connecting the wiring layer 30b and the wiring layer 50b. The insulating layer 60b includes vias V4 for electrically connecting the wiring layer 50b and the wiring layer 70b. The solder resist layer 80b includes openings 80Y so that the wiring layer 70b is partially exposed on the lowermost layer as external connection pads P2. The external connection pads P2 are for use in connecting external connection terminals such as solder balls and lead pins to be used in mounting the wiring board 1 on a mounting substrate such as motherboard. As needed, a metal layer may be formed on the external connection pads P2 so that the metal layer is connected to the external connection terminals. Examples of the metal layer include Au layer, Ni/Au layer (i.e., metal layer formed by laminating Ni layer and Au layer in this order) and Ni/Pd/Au layer (i.e., metal layer formed by laminating Ni layer, Pd layer and Au layer in this order). Portions of the wiring layer 70b exposed from the openings 80Y (or a metal layer formed on the wiring layer 70b) may also be used as external connection terminals.

Examples of a material usable for the wiring layers 50b and 70b and the vias V3 and V4 include copper and a copper alloy. Examples of a material usable for the insulating layers 40b and 60b include an insulating resin such as an epoxy-based resin and a polyimide-based resin. Examples of a material usable for the solder resist layer 80b include an insulating resin such as an epoxy-based resin.

In the wiring board 1, the connection pads P1 and the external connection pads P2 are electrically connected to each other via the wiring layers 30a, 30b, 50a, 50b, 70a and 70b, the through electrode 20 and the vias V1 to V4.

Next, a detailed structure of the core substrate 10 will be explained.

Figure 1C:
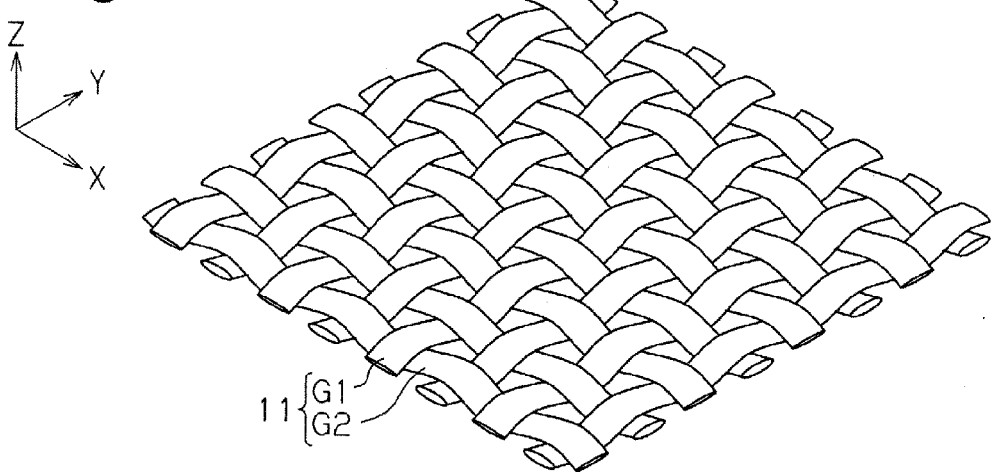
FIG. 1C is a schematic perspective view of a glass cloth.

As illustrated in FIG. 1B, the core substrate 10 includes a plurality (five in FIG. 1B) of glass cloths 11a to 11e arranged horizontally. In the following explanation, each of the glass cloths 11a to 11e may also be referred to as a glass cloth 11. As illustrated in FIG. 1C, each of the glass cloths 11 is formed such that glass fiber bundles G1 arranged side by side in X direction and glass fiber bundles G2 arranged side by side in Y direction are plain-woven in a lattice pattern. The glass fiber bundles G1 and G2 are obtained by bundling a plurality of glass fibers whose fiber diameter per one fiber is, for example, about 1 µm to about 2 µm. These glass fiber bundles G1 and G2 are provided with a thickness in a range of, for example, about 5 µm to about 10 µm. In FIG. 1C, the glass fiber bundles G1 and G2 are formed to have, but not limited to, a transverse cross section of an elliptical shape and the glass fiber bundles G1 and G2 may also have a transverse cross section of a circular shape, for example.

Other than the glass cloths 11 using glass fiber bundles, a woven fabric and a non-woven fabric using carbon fiber bundles, polyester fiber bundles, nylon fiber bundles, aramid fiber bundles and liquid crystal polymer fiber bundles or other fiber bundles may also be used as a reinforcement member. How to weave fiber bundles is not limited to a plain weave and may also be a stain weave and a twill weave or other weaves.

As illustrated in FIG. 1B, the glass cloths 11 are provided so that the glass cloths arranged in the middle region of the core substrate 10 in the thickness direction have higher density than the glass cloths arranged in the vicinity of the outer layers of the core substrate 10 (i.e., in the vicinity of the first surface 10a and in the vicinity of the second surface 10b). Specifically, the glass cloths 11 are arranged more densely in the middle region of the core substrate 10 in the thickness direction than in the vicinity of the opening ends of the through hole 10X. The glass cloths twice to three times as many as the glass cloths in the vicinity of each of the opening ends of the through hole 10X are densely embedded in the middle region of the core substrate 10 in the thickness direction. In the illustrated embodiment of FIG. 1B, the glass cloths 11a, 11b, 11c, 11d and 11d are arranged in this order from the first surface side in the core substrate 10. Three glass cloths 11b, 11c and 11d are embedded in the middle region of the core substrate 10 in the thickness direction and one glass cloth 11a or 11e is embedded in the vicinity of each of the opening ends of the through hole 10X. A distance from the first surface 10a to the glass cloth 11a which is positioned closest to the first surface 10a, or a thickness of a resin layer 12a formed to be an uppermost layer in the core substrate 10, is relatively large, for example, about 30 µm to about 50 µm. A distance from the glass cloth 11a to the glass cloth 11b which is arranged in the middle region of the core substrate 10 in the thickness direction, or a thickness of a resin layer 12b formed between the glass cloths 11a and 11b, is relatively large, for example, about 30 µm to about 50 µm. In contrast, a distance between the glass cloths 11b and 11c or between the glass cloths 11c and 11d, each of which is formed in the middle region of the core substrate 10 in the thickness direction, or a thickness of each of resin layers 12c and 12d formed between the glass cloths 11b and 11c and between the glass cloths 11c and 11d, respectively, is relatively small, for example, about 5 µm to about 10 µm. That is, the glass cloths 11 are arranged in the middle region of the through hole 10X in the thickness direction at a narrower interval than those arranged in the vicinity of the opening ends of the through hole 10X.

A distance between the glass cloths 11d and 11e, or a thickness of a resin layer 12e which occupies a space between the glass cloths 11d and 11e is relatively large, for example, about 30 µm to about 50 µm. A distance between the glass cloth 1ie to the second surface 10b, or a thickness of a resin layer 12f which is formed to be a lowermost layer in the core substrate 10 is relatively large, for example, about 30 µm to about 50 µm. Similar to the first surface side, the interval between the glass cloth 1ie arranged in the vicinity of the opening end of the through hole 10X on the second surface side and the glass cloth 11d arranged in the middle region of the core substrate 10 in the thickness direction exceeds the interval between the glass cloths 11c and 11d that are formed in the middle region of the core substrate 10 in the thickness direction. In the present specification, the middle region of the core substrate 10 in the thickness direction is a region including a midpoint in thickness of the core substrate 10 and occupying about 10% to about 30% (preferably about 10% to about 20%) in thickness of the core substrate 10. The vicinity of the opening ends of the through hole 10X is a near-surface region from one surface (i.e., the first surface 10a or the second surface 10b) of the core substrate 10 in the through hole 10X to a depth position of about 35% to about 45% in thickness of the core substrate 10. An inner wall surface of the through hole 10X corresponding to the middle region of the core substrate 10 in the thickness direction may be referred to as the middle region of the through hole 10X in the thickness direction. In the specification, each of the resin layers 12a to 12f may be referred to as a resin layer 12. The glass cloths 11a and 11e may be referred to as first reinforcement members or near-surface region reinforcement layers. The glass cloths 11b, 11c and 11d may also be referred to as second reinforcement members or middle region reinforcement layers.

Here, the reason why the glass cloths 11 are arranged densely in the middle region of the core substrate 10 in the thickness direction will be explained.

Figure 6A:
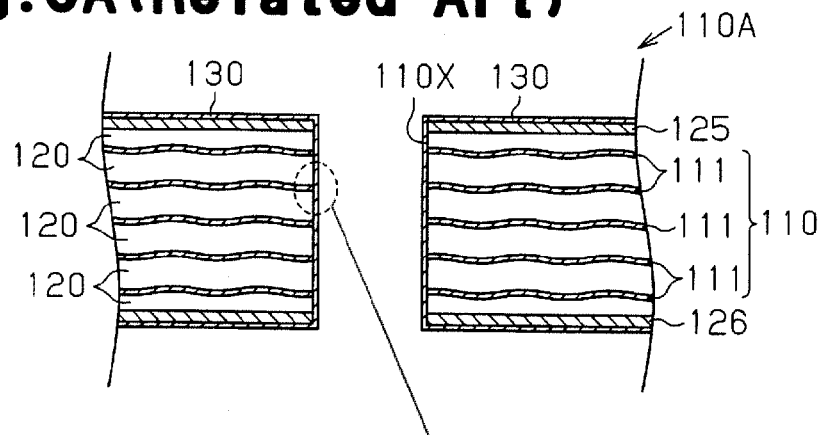
FIG. 6A is a schematic cross sectional view of a conventional wiring board provided before formation of a conductive layer in a through hole.

First of all, as illustrated in FIG. 6A, a conventional glass epoxy substrate (i.e., core substrate) 110 generally includes a plurality of glass cloths 111 arranged at even intervals in the thickness direction. That is, in the conventional core substrate 110, each of resin layers 120 formed between the glass cloths 111 has the same thickness. However, it was revealed by the study to which the present inventors devoted themselves that when a through hole 110X is formed in such a core substrate 110 and plating metal is filled in the through hole 10X for formation of a through electrode, the following problem would arise easily.

The details are such that, in order to form the through electrode, the through hole 110X of a cylindrical shape is formed first by a drill or a laser in a copper clad laminate 110A in which copper foils 125 and 126 are stuck to both surfaces of the core substrate 110, followed by applying a desmear process to the surface of the copper clad laminate 110A including an inner wall surface of the through hole 110X. Thereafter, a metal foil 130 is formed by electroless copper plating on the surface of the copper clad laminate 110A including the inner wall surface of the through hole 110X. As illustrated in FIG. 6A, the inner wall surface of the through hole 110X includes areas corresponding to end surfaces of the glass cloths 111 and areas corresponding to end surfaces of the resin layers 120.

Figure 6B:
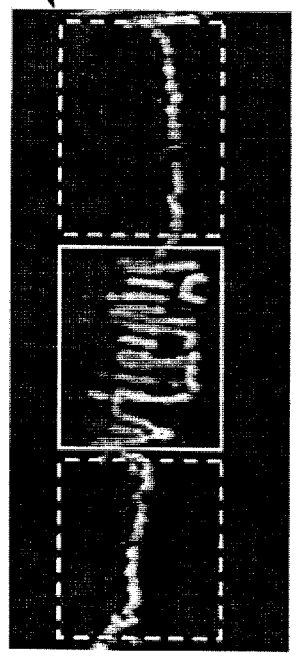
FIG. 6B is an enlarged cross sectional view of an inner wall surface of the through hole illustrated in FIG. 6A.

As illustrated in FIG. 6B, the areas corresponding to the end surfaces of the glass cloths ill (i.e., glass cloth area illustrated by a solid line frame) and the areas corresponding to the end surfaces of the resin layers 120 (i.e., resin layer areas illustrated by broken line frames) are considerably different in terms of surface roughness detected in the inner wall surface of the through hole 110X. More specifically, the surface roughness of the glass cloth area is considerably higher than that of the resin layer areas resulting from protrusion of the glass cloths 111 from the inner wall surface of the through hole 110X.

Figure 6C:
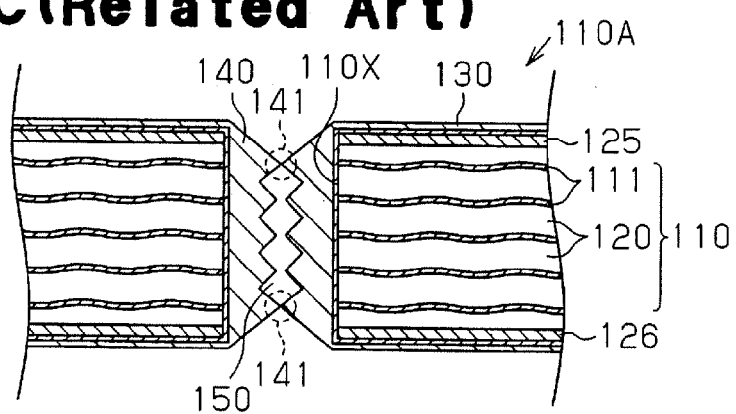
FIG. 6C is a schematic cross sectional view of a wiring board manufactured according to a conventional manufacturing method.

Regarding the through hole 110X, when a conductive layer 140 is formed inside the through hole 110X by applying electrolytic copper plating to turn the metal foil 130 into a power supply layer as illustrated in FIG. 6C, plating is deposited more preferentially on the glass cloth areas with coarse surface roughness than the resin layer areas. It is considered that acceleration of a plating deposition rate is increased in these areas since the areas with coarse surface roughness have a large surface size in which adsorption of a plating accelerator used in application of electrolytic copper plating is increased. In addition, since a current is easily concentrated on the corners in the vicinity of the opening ends of the through hole 110X, the conductive layer formed in the vicinity of the opening ends of the through hole 110X tends to be thicker than the conductive layer formed on the inner wall surface in the middle region of the through hole 110X in the thickness direction. Therefore, plating is deposited preferentially in the glass cloth areas arranged in the vicinity of the opening ends and, as illustrated in FIG. 6C, cover plating 141 may be formed and close the through hole 110X in the vicinity of both opening ends before the through hole 110X is completely filled with the conductive layer 140. In this case, a problem arises such as an elongate void 150 is formed inside the conductive layer 140 which is to fill up the through hole 110X.

Therefore, as illustrated in FIG. 1B, the glass cloths 11 of the present embodiment are arranged with higher density in the middle region of the core substrate 10 in the thickness direction than those arranged in the vicinity of the opening ends of the through hole 10X. Owing to this configuration, areas with large surface roughness (or surface size) are expanded in the middle region of the inner wall surface of the through hole 10X. Accordingly, plating is deposited more preferentially in the middle region of the through hole 10X in the thickness direction than the vicinity of the opening ends of the through hole 10X. As a result, when the conductive layer 22 is filled in the through hole 10X, the middle region of the through hole 10X is closed first.

Figure 2A:
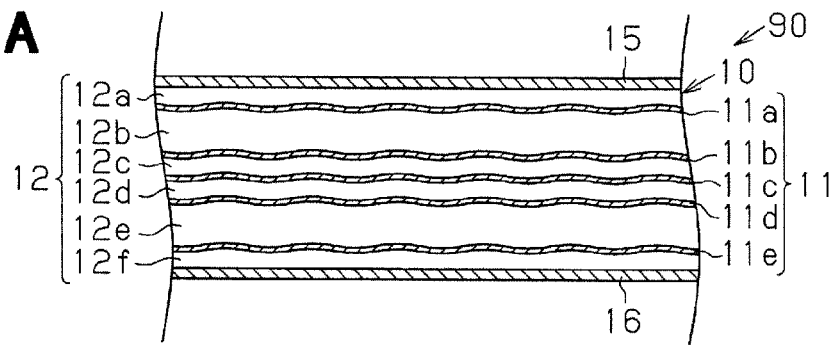
FIGS. 2A to 2D are schematic cross sectional views of a wiring board for illustrating a method for manufacturing the wiring board according to the first embodiment.

A method for manufacturing a wiring board will be discussed. As illustrated in FIG. 2A, a copper clad laminate 90 in which the copper foils 15 and 16 are stuck to both surfaces of the core substrate 10 being a glass epoxy substrate is prepared. The copper clad laminate 90 may be formed by, for example, superposing a required number of prepregs (i.e., adhesive sheets brought into a B-stage state (semi-cured state) by causing glass cloths serving as reinforcing members to be impregnated with a thermosetting resin such as an epoxy resin) and placing the copper foils 15 and 16 on both surfaces of the prepregs so as to be heated/pressed. Here, in the core substrate 10, the glass cloths 11 are arranged densely in the middle region in the thickness direction by appropriately adjusting the prepregs to have a certain thickness. Each of the copper foils 15 and 16 has a thickness in a range of, for example, about 5 μm to about 20 μm.

Figure 2B:
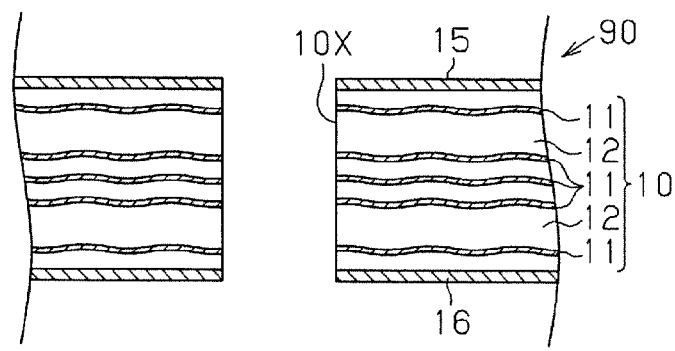

Next, in a step illustrated in FIG. 2B, the through holes of a cylindrical shape are formed in predetermined places (one through hole 10X is illustrated in FIG. 2B) of the copper clad laminate 90 so as to penetrate the core substrate 10 and the copper foils 15 and 16 formed on both surfaces of the core substrate 10 in the thickness direction. The through hole 10X may be formed by, for example, laser processing using a $Co_2$ laser, a YAG laser or an excimer laser or other lasers. Because end surfaces of the glass cloths 11 are exposed and protrude from the inner wall surface of the through hole 10X, surface roughness of the glass cloth areas exceeds surface roughness of the resin layer areas.

Next, a desmear process is performed to the entire surface of the copper clad laminate 90 including the inner wall surface of the through hole 10X. The desmear process may be performed by, for example, a potassium permanganate method.

Figure 2C:
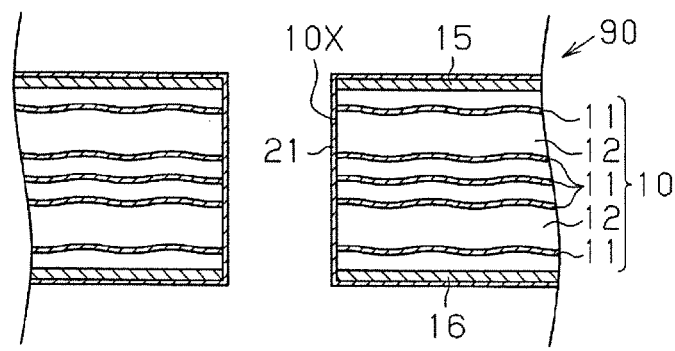

Next, in a step illustrated in FIG. 2c, the metal foil 21 is formed on the entire surface of the copper clad laminate 90 including the inner wall surface of the through hole 10X. Examples of a material usable for the metal foil 21 include copper and a copper alloy. The metal foil 21 may be formed by, for example, electroless copper plating. Shown below is one example of a plating solution and plating conditions to form the metal foil 21.

| Plating solution: | |
|---|---|
| Cu | 2.5 g/L |
| NaOH | 2 g/L |
| HCHO (reducing agent) | 2 g/L |
| pH: | 12 |
| Bath temperature: | about 30° C. |
| Time: | about 15 minutes |

The metal foil 21 formed by the electroless copper plating is formed into a shape along the surface of the copper clad laminate 90. Therefore, in the inner wall surface of the through hole 10X, surface roughness of the metal foil 21 formed on the glass cloths 11 exceeds surface roughness of the metal foil 21 formed on the resin layers 12. The metal foil 21 has a thickness in a range of, for example, about 1 μm to about 2 μm.

Figure 2D:
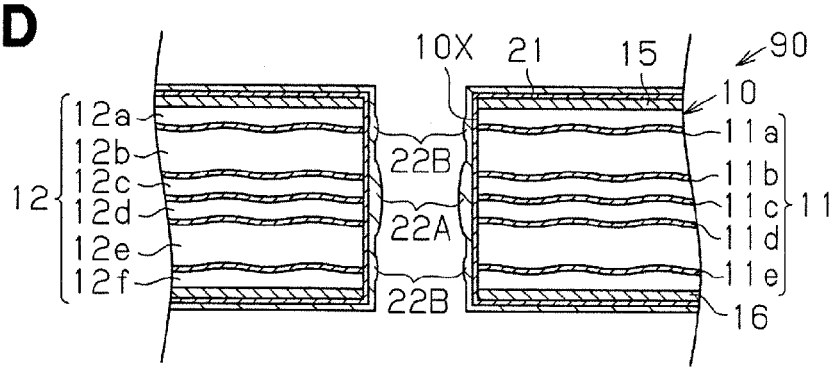

Next, in a step illustrated in FIG. 2D, an electrolytic plating method (or electrolytic copper plating method here) is applied to the surface of the metal foil 21 in order to use the metal foil 21 as a plating power supply layer. In this electrolytic copper plating method, an electrolytic copper plating solution containing a plating accelerator is used. For the plating accelerator, a well-known plating accelerator may be used. Examples of the plating accelerator include bis-(2-sulfopropyl) disulfide and/or sodium salt thereof, bis-(3-sulfopropyl) disulfide and/or sodium salt thereof, bis-(4-sulfopropyl) disulfide and/or sodium salt thereof, bis-(3-sulfo-2-hydroxypropyl) disulfide and/or sodium salt thereof, N,N-dimethyldithiocarbamate(-3-sulfopropyl ester) and/or sodium salt thereof, O-ethyl-diethyl carbonate-S(-3-sulfopropyl ester), and thiourea and/or derivatives thereof. In particular, bis-(3-sulfopropyl) disulfide disodium is a preferable plating accelerator. Explained below will be a plating solution and plating conditions in the present step (the plating solution and plating conditions are referred to as "Condition 1" hereinafter).

| Plating solution: | |
|---|---|
| Sulfuric acid | 50 g/L |
| Copper sulfate pentahydrate | 250 g/L |
| Chloride ion | 50 mg/L |
| Nonionic surfactant (polyethylene glycol (PEG)) | 100 mg/L |
| Plating accelerator (bis- (3-sulfopropyl) disulfide disodium) | 100 mg/L |
| Bath temperature: | 25° C. |
| Cathode current density: | 2.5 A/dm$^2$ |

When the copper clad laminate 90 as illustrated in FIG. 2C is immersed in the plating solution containing the plating accelerator, the plating accelerator is adsorbed to the entire surface of the metal foil 21. As stated above, larger surface roughness (or surface size) means more adsorption of a plating accelerator. Therefore, adsorption of the plating accelerator is increased on the metal foil 21 formed on the glass cloths 11. Here, electrolytic copper plating has a variable plating deposition rate depending on adsorption of a plating accelerator. More specifically, a plating deposition rate is accelerated as adsorption of a plating accelerator increases. Accordingly, as illustrated in FIG. 2D, plating is deposited preferentially in areas of the glass cloths 11 inside the through hole 10X. Further, the glass cloths 11 arranged in the middle region of the core substrate 10 in the thickness direction have higher density than the glass cloths 11 arranged in the vicinity of the opening ends of the through hole 10X. Therefore, plating is deposited more preferentially on the inner wall surface of the through hole 10X in the middle region of the through hole 10X in the thickness direction than the inner wall surface in the vicinity of the opening ends of the through hole 10X. As a result, as illustrated in FIG. 2D, a conductive layer 22A formed on the inner wall surface in the middle region of the through hole 10X is thicker than conductive layers 22B formed on the inner wall surface in the vicinity of the opening ends of the through hole 10X.

Here, explanation will be made for an experimental example illustrating how a plating deposition rate is accelerated in an area with large surface roughness as stated above.

As illustrated in FIG. 7, a substrate 200 with a copper foil was prepared and electrolytic copper plating was performed to the substrate 200 with a copper foil under the following conditions.

<Experimental Conditions>

| Plating solution: | |
| --- | --- |
| Sulfuric acid | 120 g/L |
| Copper sulfate pentahydrate | 120 g/L |
| Chloride ion | 50 mg/L |
| Nonionic surfactant (PEG) | 100 mg/L |
| Bath temperature: | 25° C. |
| Cathode current density: | about 1.0 A/dm$^2$ |

By this electrolytic copper plating, an electrolytic copper layer 210 with a thickness of about 15 μm was formed on the substrate 200 with a copper foil. Thereafter, the substrate 200 including the electrolytic copper layer 210 was processed using a copper foil etching agent. Four samples A to D each of which is different in surface roughness of the electrolytic copper layer 210 were prepared by immersing the substrate 200 including the electrolytic copper layer 210 in a copper foil etching agent for different amounts of time.

| Sample A: | immersion time 10 seconds |
| --- | --- |
| Sample B: | immersion time 20 seconds |
| Sample C: | immersion time 30 seconds |
| Sample D: | immersion time 40 seconds |

Surface roughness Ra was measured for each of samples A to D. The results are as follows.

| Sample A: | Ra = 0.08 μm |
| --- | --- |
| Sample B: | Ra = 0.14 μm |
| Sample C: | Ra = 0.17 μm |
| Sample D: | Ra = 0.52 μm |

The surface roughness Ra is also called arithmetic mean roughness. The surface roughness Ra is calculated by measuring, in a plurality of measurement positions within a measurement area of a certain size, a height from a mean surface (or average level) within the measurement area and arithmetically averaging absolute values of measured heights.

Next, electrolytic copper plating was performed to the samples A to D each of which is different in surface roughness of the electrolytic copper layer 210 so as to turn the electrolytic copper layer 210 into a power supply layer. A plating solution and plating conditions are as follows.

| Plating solution: | |
| --- | --- |
| Sulfuric acid | 50 g/L |
| Copper sulfate pentahydrate | 250 g/L |
| Chloride ion | 50 mg/L |
| Nonionic surfactant (PEG) | 100 mg/L |
| Plating accelerator (bis-(3-sulfopropyl) disulfide disodium) | 100 mg/L |
| Bath temperature: | 25° C. |
| Cathode current density: | about 1.0 A/dm$^2$ |
| Time: | 30 minutes |

Figure 8:
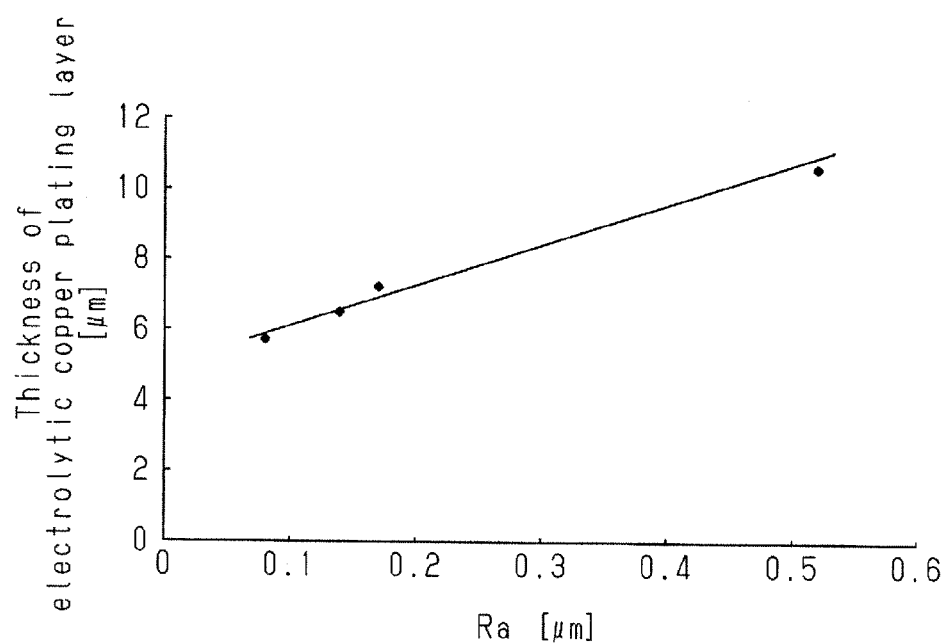
FIG. 8 is a graph illustrating a plating deposition rate corresponding to the surface roughness of the foundations of electrolytic copper plating.

That is, the same plating solution (i.e., electrolytic copper plating solution containing accelerator) as the one used in the step of FIG. 2D (i.e., electrolytic copper plating) was used to apply electrolytic copper plating onto the electrolytic copper layer 210 only for a certain amount of time. A thickness of an electrolytic copper plating layer 220 formed on the electrolytic copper layer 210 was measured for each of the samples A to D. The results are illustrated in FIG. 7 and FIG. 8. That is, FIGS. 7A to 7D indicate a state where the electrolytic copper plating layer 220 has been formed on the electrolytic copper layer 210 in the respective samples A to D, and FIG. 8 graphically illustrates a thickness of the electrolytic copper plating layer 220 measured for the samples A to D each of which illustrates a different value in the surface roughness Ra.

<Experimental Results>

As indicated in FIGS. 7 and 8, the electrolytic copper plating layer 220 formed on the electrolytic copper layer 210 is made thicker in accordance with an increase in surface roughness of a power supply layer (which is the electrolytic copper layer 210 here) serving as a foundation of electrolytic copper plating. That is, a plating deposition rate is accelerated and an amount of plating deposition becomes larger as surface roughness of the electrolytic copper layer 210 serving as a foundation of electrolytic copper plating increases.

Figure 3A:
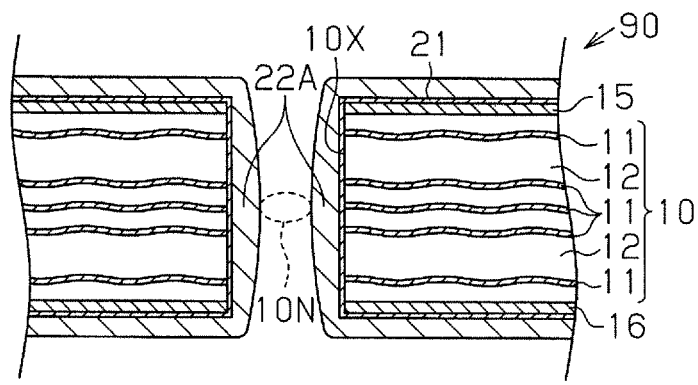
FIGS. 3A to 3C are schematic cross sectional views of the wiring board for illustrating the method for manufacturing the wiring board according to the first embodiment.
Figure 3B:
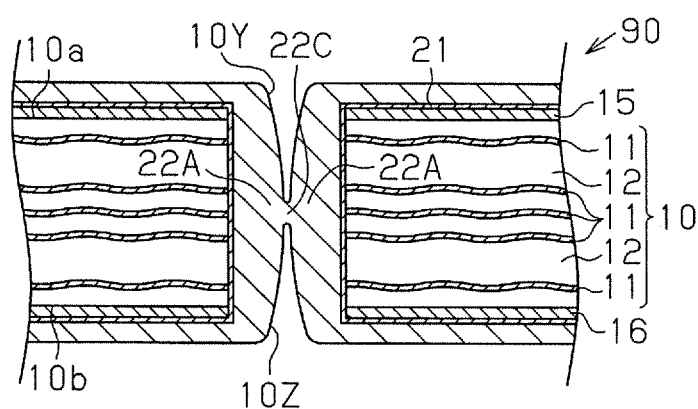

As supported by the experimental results, owing to the application of electrolytic copper plating to the copper clad laminate 90 as illustrated in FIG. 2D in which the glass cloths 11 with large surface roughness detected in the inner wall surface of the through hole 10X are arranged densely in the middle region in the thickness direction, plating is deposited more preferentially on the inner wall surface of the through hole 10X in the middle region in the thickness direction. Therefore, the conductive layer 22A formed on the inner wall surface in the middle region of the through hole 10X is made thicker than the conductive layers 22B formed on the inner wall surface in the vicinity of the opening ends of the through hole 10X. Therefore, as illustrated in FIG. 3, continuously performing electrolytic copper plating under Condition 1 forms a narrowest portion 10N in which the through hole 10X has a narrowest opening diameter in the middle region of the through hole 10X (which is where the glass cloths 11 are densely arranged). Further continuation of electrolytic copper plating under Condition 1 concentrates a current in the thick conductive layer 22A formed in the middle region of the through hole 10X so that the electrolytic layer 22A grows much thicker in the middle region of the through hole 10X. Later, as illustrated in FIG. 3B, the narrowest portion 10N (see FIG. 3A) is closed by the conductive layer 22A formed in the middle region of the through hole 10X. When a closed portion 22C is formed by the conductive layer 22A, recesses 10Y and 10Z are formed. The recesses 10Y and 10Z share the closed portion 22C as a common bottom and are opened to the first surface 10a and the second surface 10b of the core substrate 10, respectively.

Figure 3C:
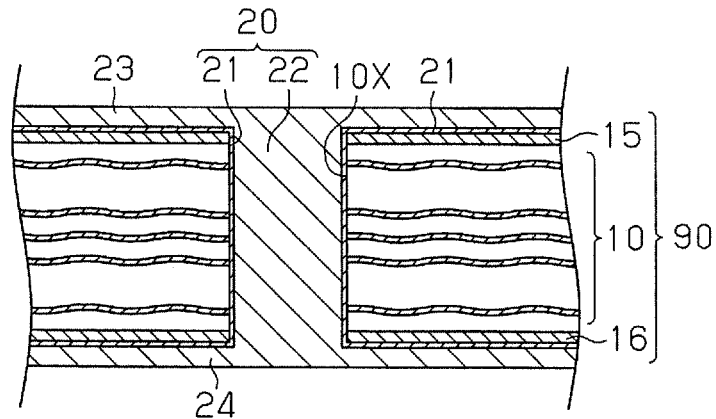

Through continuously performing the electrolytic copper plating under Condition 1, the conductive layer is filled in the recess 10Y and 10Z as illustrated in FIG. 3C. Therefore, the conductive layer 22 is formed without defects such as a void inside the through hole 10X so that the through electrode 20 made of the conductive layer 22 and the metal foil 21 is formed. The conductive layer 23 for coating an upper surface of the conductive layer 22 and an upper surface of the metal foil 21 is formed and the conductive layer 24 for coating a lower surface of the conductive layer 22 and a lower surface of the metal foil 21 is formed.

Figure 4A:
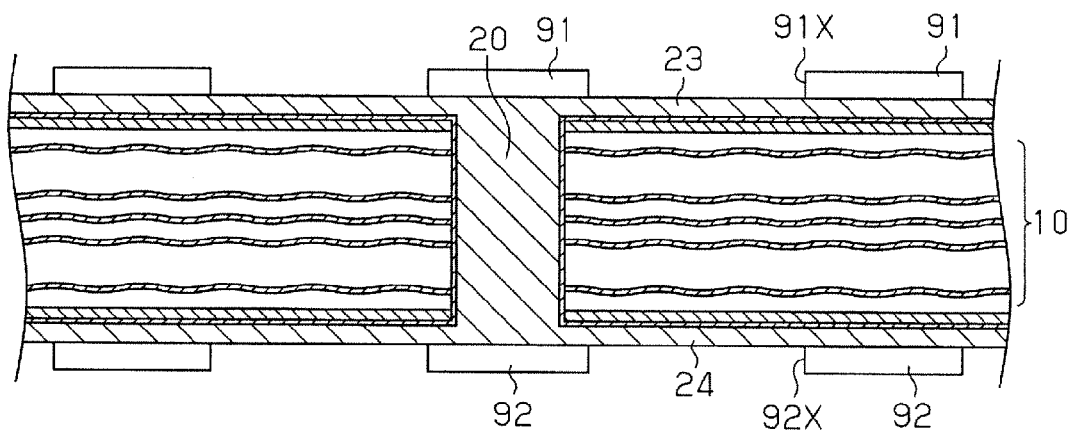
FIGS. 4A to 4C are schematic cross sectional views of the wiring board for illustrating the method for manufacturing the wiring board according to the first embodiment.

Next, in a step illustrated in FIG. 4A, a resist layer 91 having openings 91X in predetermined places is formed on an upper surface of the conductive layer 23. The resist layer 91 is formed so as to coat the conductive layer 23 in areas corresponding to the wiring layer 30a (see FIG. 1A). On a lower surface of the conductive layer 24, a resist layer 92 having openings 92X in predetermined places is formed. The resist layer 92 is formed so as to coat the conductive layer 24 in areas corresponding to the wiring layer 30b (see FIG. 1A). Materials such as a photoreceptive dry film resist and a liquid photoresist (e.g. a dry film resist made of a novolac resin and an acrylic resin or the like and a liquid resist) may be used for the resist layers 91 and 92. For example, in the case of using a photoreceptive dry film resist, a dry film is laminated on an upper surface of the conductive layer 23 or a lower surface of the conductive layer 24 by thermocompression bonding and a pattern is formed on the dry film by exposure/development for formation of the resist layers 91 and 92. The resist layers 91 and 92 are also formed through similar steps using a liquid photoresist.

Figure 4B:
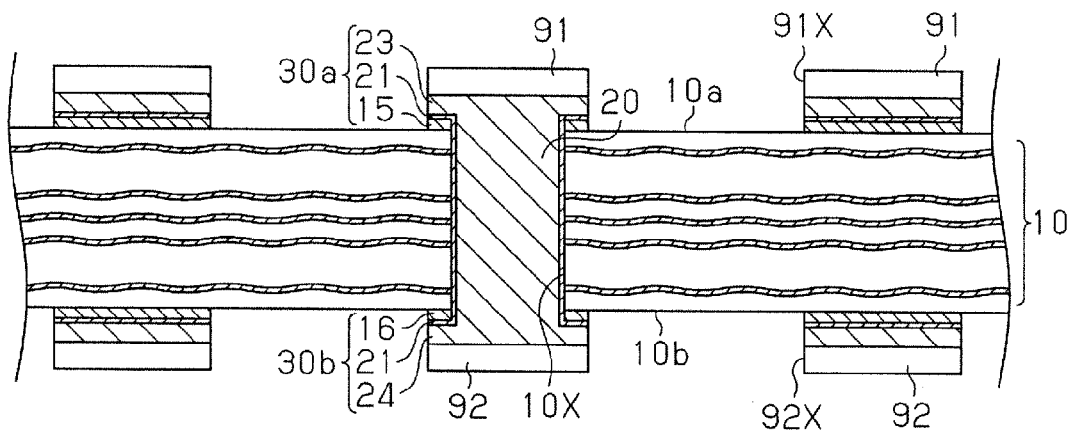

Next, in a step illustrated in FIG. 4B, the resist layers 91 and 92 are used as an etching mask to etch the conductive layers 23 and 24, the metal foil 21 and the copper foils 15 and 16 so as to be patterned with a predetermined shape. Therefore, on the first surface 10a of the core substrate 10, the wiring layer 30a is formed by laminating the copper foil 15, the metal foil 21 and the conductive layer 23. Under the second surface 10b of the core substrate 10, the wiring layer 30b is formed by laminating the copper foil 16, the metal foil 21 and the conductive layer 24. The wiring layer 30a and the wiring layer 30b are connected to each other electrically via the through electrode 20 formed inside the though hole 10X.

Figure 4C:
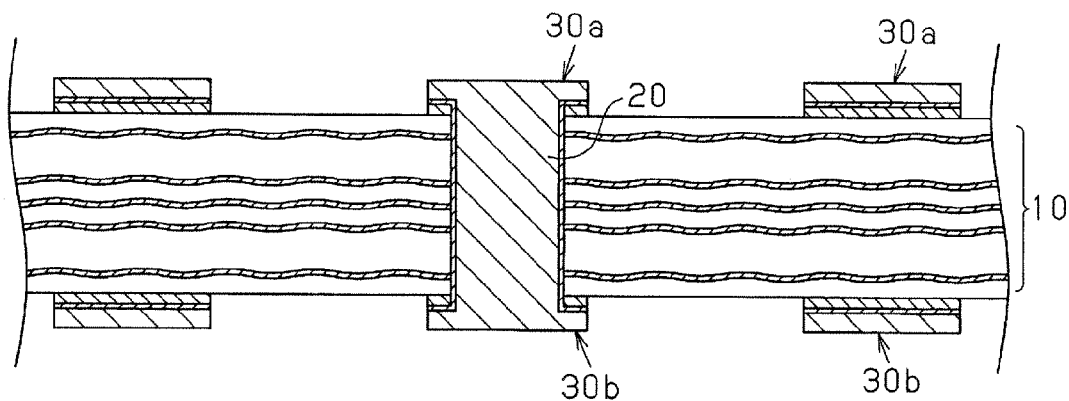

Next, in a step illustrated in FIG. 4C, the resist layers 91 and 92 as illustrated in FIG. 4B are removed by, for example, an alkaline stripper.

Figure 5A:
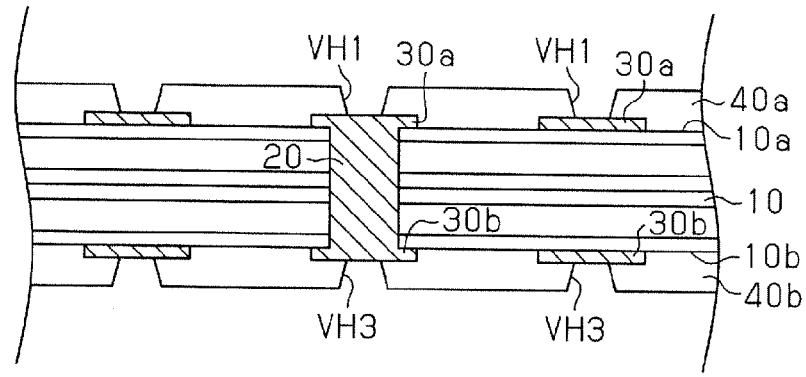
FIGS. 5A to 5C are schematic cross sectional views of the wiring board for illustrating the method for manufacturing the wiring board according to the first embodiment.

Next, in a step illustrated in FIG. 5A, the insulating layer 40a for coating the first surface 10a of the core substrate 10 and the wiring layer 30a and the insulating layer 40b for coating the second surface 10b of the core substrate 10 and the wiring layer 30b are formed first. These insulating layers 40a and 40b can be formed by, for example, laminating a resin film on the core substrate 10 and subsequently pressing and heat-treating the resin film at a temperature in a range of about 130° C. to about 150° C. to harden it. Thereafter, as illustrated in FIG. 5A, via holes VH1 are formed in predetermined places of the insulating layer 40a so as to expose an upper surface of the wiring layer 30a. Via holes VH3 are formed in predetermined places of the insulating layer 40b so as to expose a lower surface of the wiring layer 30b. The via holes VH1 and VH3 may be formed by a laser processing using, for example, a $CO_2$ laser and a YAG laser or other lasers. If the insulating layers 40a and 40b are formed from a photoreceptive resin, the via holes VH1 and VH3 may be formed as needed by, for example, a photolithography technique.

Next, if the via holes VH1 and VH3 are formed by a laser processing, a desmear process is performed to remove resin smears attached to exposed surfaces of the wiring layers 30a and 30b that are exposed at the bottom of the via holes VH1 and VH3.

Figure 5B:
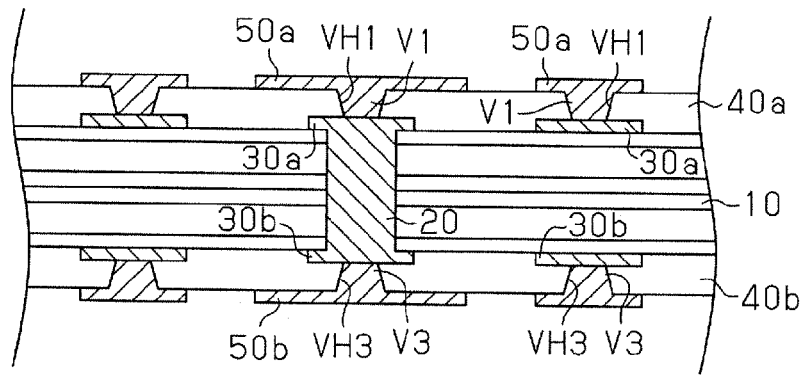

Next, in a step illustrated in FIG. 5B, the vias V1 are formed in the via holes VH1 of the insulating layer 40a and the wiring layer 50a which is electrically connected to the wiring layer 30a via the vias V1 is laminated on the insulating layer 40a. The vias V3 are formed in the via holes VH3 of the insulating layer 40b and the wiring layer 50b which is electrically connected to the wiring layer 30b via the vias V3 is laminated on the insulating layer 40b. The vias V1 and V3 and the wiring layers 50a and 50b can be formed by various methods for forming wiring such as, for example, a semi-additive method and a subtractive method.

Figure 5C:
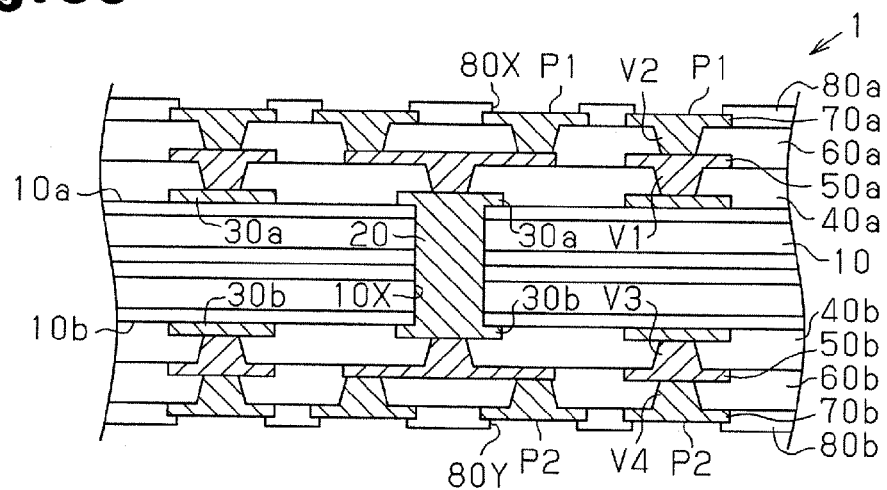

Next, steps similar to the steps illustrated in FIG. 5A and FIG. 5B are executed again so that, as illustrated in FIG. 5C, the insulating layer 60a and the wiring layer 70a are laminated on the first surface side of the core substrate 10 while the insulating layer 60b and the wiring layer 70b are laminated on the second surface side of the core substrate 10.

Next, in a step illustrated in FIG. 5C, the solder resist layer 80a having the openings 80X for exposing the connection pads P1 defined in required places of the wiring layer 70a is laminated on the insulating layer 60a and the wiring layer 70a. The solder resist layer 80b having the openings 80Y for exposing the external connection pads P2 defined in required places of the wiring layer 70b are laminated on the insulating layer 60b and the wiring layer 70b. These solder resist layers 80a and 80b can be formed by, for example, laminating a photoreceptive solder resist film or applying a liquid solder resist so as to pattern the resist with a required shape. Owing to this step, the wiring layer 70a is partially exposed as the connection pads P1 from the openings 80X of the solder resist layer 80a and the wiring layer 70b is partially exposed as the external connection pads P2 from the openings 80Y of the solder resist layer 80b. On these pads P1 and P2, for example, a metal layer made of Ni and a metal layer made of Au may be laminated in a sequential order. These metal layers may be formed by, for example, an electroless plating method.

Owing to the above manufacturing steps, the wiring board 1 as illustrated in FIG. 1A can be manufactured.

The present embodiment has the advantages described below.

(1) The glass cloths 11 are arranged with higher density in the middle region of the core substrate 10 in the thickness direction than the vicinity of the opening ends of the through hole 10X. Owing to this configuration, in application of electrolytic copper plating, plating can be deposited more preferentially in the middle region of the through hole 10X than the vicinity of the opening ends of the through hole 10X. Accordingly, when the conductive layer 22 is filled in the through hole 10X, the middle region of the through hole 10X may be closed first so that the conductive layer 22 can be formed without defects such as a void inside the through hole 10X. As a result, connection reliability may be improved between the wiring layers 30a and 30b that are connected to each other electrically via the through electrode 20.

Furthermore, even if an aspect ratio of the through hole 10X is 2 or more due to further miniaturization of a wiring pattern, plating metal can be sufficiently filled in the through hole 10X by employing the above configuration, whereby the conductive layer 22 can be formed without defects such as a void inside the through hole 10X. Accordingly, it is possible to respond to further miniaturization of a wiring pattern.

(2) Owing to application of electrolytic copper plating using a plating solution for use in conventional electrolytic copper plating, the conductive layer 22 can be formed without defects such as a void inside the through hole 10X. Accordingly, it is unnecessary to specially adjust a composition of a plating solution or the like.

(3) The glass cloths twice or three times as many as the glass cloths arranged in the vicinity of the opening ends of the through hole 10X are arranged densely in the middle region of the core substrate 10 in the thickness direction. The core substrate 10 can be easily manufactured by adjusting the thickness of each of the resin layers 12 to be formed in a space between the glass cloths 11.

Modified Example of First Embodiment

The first embodiment may be modified as follows.

Figure 9:
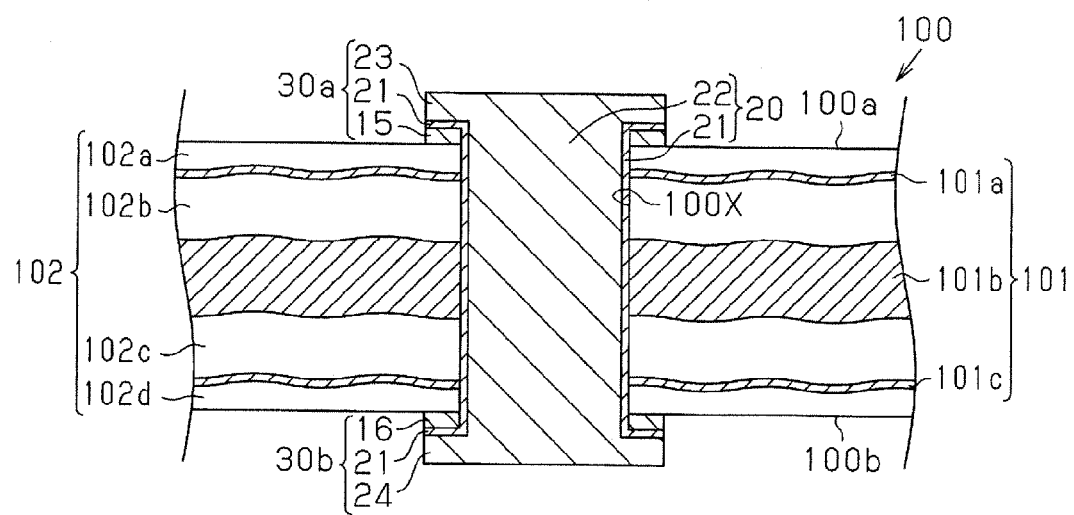
FIG. 9 is a schematic partial cross sectional view of a modified example of the wiring board.

As illustrated in a core substrate 100 of FIG. 9, an adjustment may be made so that glass cloths 101 have higher density in the middle region of the through hole 100X in the thickness direction than the vicinity of opening ends of the through hole 100X by changing a thickness of each of the glass cloth 101 in the middle region of the through hole 100X in the thickness direction as well as in the vicinity of the opening ends of the through hole 100X. More specifically, in the core substrate 100, the glass cloth 101 formed in the middle region of the through hole 100X in the thickness direction is made thicker than the glass cloths 101 formed in the vicinity of the opening ends of the through hole 100X. The details are such that, in the core substrate 100, glass cloths 101a, 101b and 101c are provided in this order from a first surface side. That is, the glass cloths 101a and 101c are arranged in the vicinity of the opening ends of the through hole 100X and the glass cloth 101b is arranged in the middle region of the through hole 100X in the thickness direction. Thus, the glass cloth 101b which is as many as the glass cloth 101a (or the glass cloth 101c) arranged in the vicinity of one opening end of the through hole 100X is arranged in the middle region of the through hole 100X in the thickness direction. Here, each of the glass cloths 101a and 101c formed in the vicinity of the opening ends of the through hole 100X has a thickness in a range of, for example, about 5 µm to about 10 µm. In contrast, the glass cloth 101b formed in the middle region of the through hole 100X in the thickness direction has a thickness in a range of, for example, about 15 µm to about 30 µm which is thicker than the glass cloths 101a and 101b. A resin layer 102a formed on an upper surface of the glass cloth 101a, a resin layer 102b formed between the glass cloths 101a and 101b, a resin layer 102c formed between the glass cloths 101b and 101c and a resin layer 102d formed on a lower surface of the glass cloth 101c are provided with a thickness in a range of, for example, 30 to 50 µm. Each of the resin layers 102a to 102d may also be referred to as a resin layer 102. The glass cloths 101a and 101c may also be referred to as first reinforcement members or near-surface region reinforcement layers. The glass cloth 101b may also be referred to as a second reinforcement member or a middle region reinforcement layer.

Figure 10A:
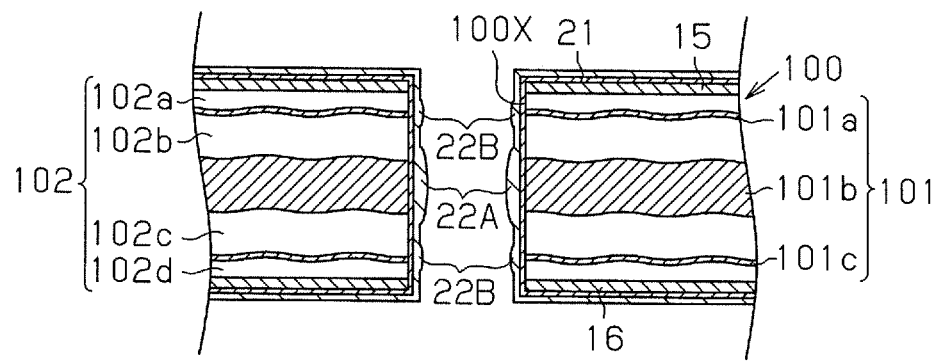
FIGS. 10A to 10C are schematic cross sectional views illustrating a method for manufacturing the modified example of the wiring board.
Figure 10B:
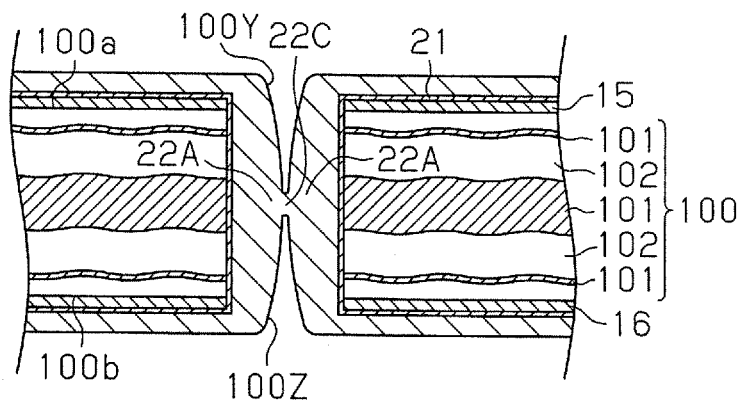

Even with such a configuration, advantages similar to (1) of the first embodiment can be exhibited. The details are such that, according to a manufacturing method similar to the first embodiment, through formation of the through hole 100X on a copper clad laminate, in which the copper foils 15 and 16 are stuck to both surfaces of the core substrate 100, and subsequent application of a desmear process, electroless copper plating and electrolytic copper plating in a sequential order, the conductive layer 22 can be formed without defects such as a void inside the through hole 100X. FIG. 10 illustrates a state of a wiring board in which electrolytic copper plating process has been performed. Here, regarding the metal foil 21 serving as a foundation of electrolytic copper plating, in an inner wall surface of the through hole 100X, surface roughness of the metal foil 21 formed on the glass cloths 101 exceeds surface roughness of the metal foil 21 formed on the resin layers 102. Therefore, as illustrated in FIG. 10A, electrolytic copper plating process is performed such that plating is deposited more preferentially on the glass cloth areas inside the through hole 100X. In addition, in the core substrate 100, the glass cloth 101b formed in the middle region of the through hole 100X in the thickness direction is made thicker than the glass cloths 101a and 101c formed in the vicinity of the opening ends of the through hole 10X. Therefore, the glass cloths 101 is arranged with high density in the middle region of the through hole 100X in the thickness direction. Accordingly, plating is deposited more preferentially on the inner wall surface in the middle region of the through hole 100X in the thickness direction than the inner wall surface in the vicinity of the opening ends of the through hole 100X. Owing to this configuration, as illustrated in FIG. 10A, the conductive layer 22A formed on the inner wall surface in the middle region of the through hole 100X in the thickness direction is made thicker than the conductive layers 22B formed on the inner wall surface in the vicinity of the opening ends of the through hole 100X. This is why continuously performing the electrolytic copper plating concentrates a current in the thick conductive layer 22A formed in the middle region of the through hole 100X and the conductive layer 22A becomes much thicker in the middle region of the through hole 100X. Later, as illustrated in FIG. 10B, the conductive layer 22A occupies a space in the middle region of the through hole 100X in the thickness direction and forms the closed portion 22C which closes the through hole 100X. At this time, recesses 100Y and 100Z are formed. The recesses 100Y and 100Z are opened to a first surface 100a and a second surface 100b of the core substrate 100 respectively and share the closed portion 22c as a common bottom.

Figure 10C:
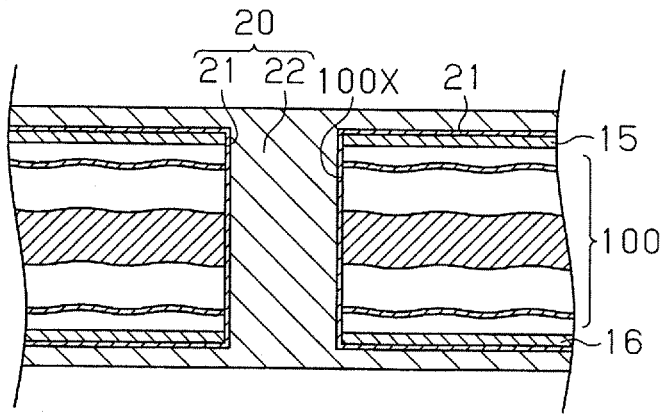

Continuously performing the electrolytic copper plating gradually makes the recesses 100Y and 100Z smaller and finally, as illustrated in FIG. 10C, each of the recesses 100Y and 100Z is completely filled by the conductive layer. Owing to this process, the conductive layer 22 can be formed without defects such as a void inside the through hole 100X and the through electrode 20 made of the conductive layer 22 and the metal foil 21 can be formed.

The wiring layers 30a and 30b and the through electrode 20 may also be formed according to the following steps. That is, after formation of the metal foil 21 on the inner wall surface of the through hole 10X and the entire surface of the copper clad laminate 90 as illustrated in FIG. 2C, the resist layer 91 (see FIG. 4A) is formed to expose portions to be the wiring layers 30a and 30b on the metal foil 21. Next, the conductive layer 22 is deposited on the metal foil 21 exposed from the resist layer 91 by electrolytic copper plating to turn the metal foil 21 into a power supply layer. Next, the resist layer 91 is removed and the metal foil 21 and the copper foils 15 and 16 that are exposed from removed portions of the resist layer 91 are removed by etching. Thus, formation of the through electrode 20 and the wiring layers 30a and 30b may be realized.

The first embodiment uses an electrolytic copper plating solution containing a plating accelerator in the process of electrolytic copper plating for formation of the conductive layer 22 inside the through hole 10X. This is not limited and, for example, the structure illustrated in FIG. 2C may be immersed in a plating accelerator solution prepared by adding a plating accelerator so as to allow adsorption of the plating accelerator to the surface of the metal foil 21, followed by application of electrolytic copper plating using an electrolytic copper plating solution without containing a plating accelerator.

In the first embodiment, the number of the wiring layers and the insulating layers to be laminated on the core substrate 10 is not particularly limited. For example, a solder resist layer may be formed on the wiring layers 30a and 30b that have been formed in the step of FIG. 4C. In this case, the solder resist layer includes formation of openings for partially exposing the wiring layers 30a and 30b as pads.

In the first embodiment and each of the modified examples, the copper foils 15 and 16 are stuck to both surfaces of the core substrate 10 or 100 but the copper foils 15 and 16 may also be omitted. In this case, for example, the metal foil 21 is formed directly on the resin layers 12 to constitute each of the first surface 10a and the second surface 10b of the core substrate 10, and the conductive layer 22, the conductive layer 23 and the conductive layer 24 are formed on the metal foil 21.

A second embodiment will be explained below referring to FIG. 11. The present embodiment exemplifies a semiconductor device 2 in which the semiconductor chip 3 is mounted on the wiring board 1. Same reference numbers refer to same members explained in the first embodiment and detailed explanation of these components is omitted.

As illustrated in FIG. 11, the semiconductor device 2 includes the wiring board 1, the semiconductor chip 3 which is flip-chip connected to the wiring board 1, and an underfill resin 4. Solders 71 are formed on the connection pads P1 of the wiring board 1. For the solders 71, for example, a eutectic solder and a lead (Pb)-free solder (such as An—Ag based, Sn—Cu based and Sn—Ag—Cu based) can be used.

The semiconductor chip 3 includes a plurality of bumps 3a formed on a circuit formation surface (lower surface in FIG. 11). The semiconductor chip 3 is electrically connected to the connection pads P1 of the wiring board 1 via the bumps 3a and the solders 71.

The underfill resin 4 is provided so as to fill up a gap between the wiring board 1 and the semiconductor chip 3. Examples of a material usable for the underfill resin 4 include an insulating resin such as an epoxy-based resin.

Modified Example of Second Embodiment

The semiconductor chip 3 (e.g. flip-chip mounting and mounting by wire bonding or combination thereof) may be mounted in any manner other than that of the second embodiment.

Although the case of mounting the semiconductor chip 3 on the wiring board 1 was explained in the second embodiment, a mounting body is not limited to the semiconductor chip 3. For example, the embodiment is applicable to a package with a structure of laminating another wiring board on the wiring board 1 (i.e., package-on-package).

Example

As illustrated in FIG. 2A, the copper clad laminate 90 was prepared such that the copper foils 15 and 16 with a thickness of 18 µm are stuck to both surfaces of the core substrate 10 with a thickness of 200 µm. Here, the core substrate 10 contains the plurality of the glass cloths 11a to 11e each of which is obtained by bundling glass fibers whose fiber diameter is about 1 µm per one fiber and set to a thickness of about 10 µm. The glass cloths 11a and 11e arranged in the vicinity of the first surface 10a and the second surface 10b of the core substrate 10 are spaced apart from the glass cloths 11b and 11d arranged in the middle region of the core substrate 10 in the thickness direction at an interval set to about 30 µm, respectively, and the glass cloths 11b, 11c and 11d arranged in the middle region are spaced apart from each other at an interval set to about 10 µm.

After the through hole 10X of a cylindrical shape has been formed with a diameter of 80 µm by a drill in the copper clad laminate 90, a desmear process was performed by a potassium permanganate method. Thereafter, the metal foil 21 was formed by electroless copper plating on the entire surface of the copper clad laminate 90 including the inner wall surface of the through hole 10X. The electroless copper plating was executed under the plating solution and the plating conditions as illustrated in one example above. Next, an electrolytic copper plating process was performed on the entire surface of the metal foil 21 so as to turn the metal foil 21 into a power supply layer. The electrolytic copper plating was executed under Condition 1.

After 40 minutes from the start of the electrolytic copper plating, similar to FIG. 2D, the conductive layer 22A was formed thicker on the inner wall surface of the middle region of the through hole 10X in the thickness direction than the inner wall surface in the vicinity of the opening ends of the through hole 10X.

The electrolytic copper plating was further continued and after 60 minutes from the start of the electrolytic copper plating, similar to FIG. 3B, the through hole 10X was closed in the middle region of the through hole 10X and the recesses 10Y and 10Z were formed by sharing the closed portion 22C as a bottom. The electrolytic copper plating process was performed continuously and after 180 minutes from the start of the electrolytic copper plating, similar to FIG. 3C, each of the recesses 10Y and 10Z is filled with the conductive layer and the conductive layer 22 was formed without defects such as a void inside the through hole 10X. That is, even if the through hole 10X has an opening diameter of 80 µm with a depth of 236 µm (total thickness of the core substrate 10 and the copper foils 15 and 16) and an aspect ratio of the through hole 10X is about 3, formation of the conductive layer 22 was achieved without defects such as a void inside the through hole 10.

All examples and conditional language recited herein are intended for pedagogical purposes to aid the reader in understanding the principles of the invention and the concepts contributed by the inventor to further the art, and are to be construed as being without limitation to such specifically recited examples and conditions, nor does the organization of such examples in the specification relate to a illustrating of the superiority and inferiority of the invention. Although the embodiment of the present invention has been described in detail, it should be understood that the various changes, substitutions, and alterations could be made hereto without departing from the spirit and scope of the invention.

The invention claimed is:

1. A wiring board comprising:
   a resin substrate in which a plurality of reinforcement members are arranged horizontally, wherein the resin substrate is free from a wiring layer;
   a through electrode filled in a through hole penetrating the substrate in the thickness direction; and
   wiring layers respectively formed on both surfaces of the substrate and electrically connected to each other via the through electrode, wherein the plurality of the reinforcement members are non-uniformly distributed in the thickness direction, with one or more of reinforcement members being densely distributed in a middle region of the substrate in the thickness direction and a remainder of the reinforcement members being sparsely distributed in near-surface regions of the substrate that are the regions other than the middle region of the substrate, wherein the reinforcement members in the middle region of the substrate in the thickness direction have a higher density than the reinforcement members in the near-surface regions of the substrate.

2. The wiring board according to claim 1, wherein the plurality of the reinforcement members includes at least one first reinforcement member arranged in the vicinity of an opening end of the through hole and a plurality of second reinforcement members arranged in the middle region with the number of the second reinforcement members exceeding the number of the at least one first reinforcement member; and
   the plurality of the second reinforcement members are spaced apart from each other at intervals narrower than an interval between one first reinforcement member and one second reinforcement member that are located adjacent to each other.

3. The wiring board according to claim 1, wherein the reinforcement member formed in the middle region of the substrate is thicker than the reinforcement member formed in the vicinity of an opening end of the through hole.

4. The wiring board according to claim 3, wherein the middle region includes the reinforcement member as many as the reinforcement member arranged in the vicinity of the opening end of the through hole.

5. The wiring board according to claim 1, wherein each of the reinforcement members is a woven fabric or a non-woven fabric made of fibers selected the group consisting of glass fibers, aramid fibers, carbon fibers, polyester fibers, nylon fibers and liquid crystal polymer fibers.

6. A semiconductor device comprising:
   the wiring board according to claim 1; and
   a semiconductor chip mounted on the wiring board.

7. The wiring board according to claim 1, wherein:
   an inner wall surface defining the through hole includes a middle region inner wall surface corresponding to the middle region of the substrate and near-surface inner wall surfaces other than the middle region inner wall surface;
   the plurality of the reinforcement layers consisting of
   one or more middle region reinforcement layers embedded in the middle region of the substrate in the thickness direction and having one or more end surfaces exposed to the middle region inner wall surface of the through hole, and
   a plurality of near-surface region reinforcement layers embedded in the near-surface regions of the substrate and having end surfaces exposed to the near-surface inner wall surfaces of the through hole, and
   a ratio in thickness of the middle region reinforcement layers relative to the plurality of the reinforcement layers is higher than a ratio in thickness of the near-surface region reinforcement layers relative to the plurality of the reinforcement layers.

8. The wiring board according to claim 7, wherein the number of the middle region reinforcement members that have end surfaces exposed to the middle region inner wall surface of the through hole exceeds the number of the near-surface region reinforcement members that have end surfaces exposed to the near-surface region inner wall surfaces of the through hole.

9. The wiring board according to claim 8, wherein the substrate includes:
   a first insulating resin layer between one near-surface region reinforcement layer and one middle region reinforcement layer that are adjacent to each other and
   a plurality of second insulating resin layers between the middle region reinforcement layers, wherein each of the second insulating resin layers is thinner than the first insulating resin layer.

10. The wiring board according to claim 7, wherein:
    the number of the middle region reinforcement layers is less than the number of the near-surface region reinforcement layers; and
    each middle region reinforcement layer is thicker than each of the near-surface region reinforcement layers.

11. The wiring board according to claim 1, wherein:
    the middle region of the substrate in the thickness direction includes a midpoint in thickness of the substrate and occupies about 10% to about 30% in thickness of the substrate, and
    each of the near-surface regions occupies about 35% to about 45% in thickness of the substrate.

12. The wiring board according to claim 1, wherein the through electrode is a plated metal that fills the through hole.

13. The wiring board according to claim 1 further comprising wiring layers and insulating layers laminated on both surfaces of the substrate.

* * * * *